[54] RESINS OF LOW THERMAL EXPANSIVITY

[75] Inventor: Hisashi Watanabe, Kitakyushu, Japan

[73] Assignee: Nippon Steel Chemical Co., Ltd., Tokyo, Japan

[21] Appl. No.: 122,085

[22] Filed: Nov. 17, 1987

[30] Foreign Application Priority Data

Nov. 20, 1986 [JP] Japan .................. 61-275324

[51] Int. Cl.$^4$ ............................................. C08G 73/10
[52] U.S. Cl. ..................... 528/353; 528/188; 528/184; 528/329.1
[58] Field of Search ............. 528/353, 188, 184, 329.1

[56] References Cited

U.S. PATENT DOCUMENTS

| | | | |
|---|---|---|---|
| 3,179,635 | 4/1965 | Frost et al. | 528/128 |
| 3,511,728 | 5/1970 | Freedman et al. | 156/247 |
| 3,536,545 | 10/1970 | Traynor et al. | 156/659.1 |
| 4,640,972 | 2/1987 | Irwin | 528/353 |

FOREIGN PATENT DOCUMENTS 243120 12/1985 Japan .
250031 12/1985 Japan .

*Primary Examiner*—John Kight
*Assistant Examiner*—M. L. Moore
*Attorney, Agent, or Firm*—Armstrong, Nikaido, Marmelstein & Kubovcik

[57] ABSTRACT

Polyamide-imides of low thermal expansivity having a repeating structural unit of the general formula (I)

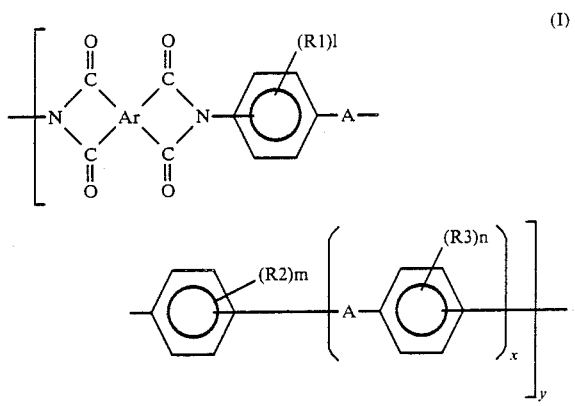

in which Ar is a tetravalent aromatic group, A is —NH—CO—, R1 through R3 are alkyl, alkoxy, or halogen, l, m, and n are integers from 0 to 4, x is 0 or 1, and y is an integer indicating the number of repeating units and in which at least one alkoxy group is present, show improved mechanical (for example, flexibility) and adhesive properties and low water absorption and are useful for the manufacture of flexible base materials for printed circuit boards, etc.

10 Claims, No Drawings

RESINS OF LOW THERMAL EXPANSIVITY

FIELD OF THE INVENTION AND RELATED ART STATEMENT

This invention relates to resins of low thermal expansivity consisting of polyamide-imides.

Organic polymers mostly show linear thermal expansion coefficients of $4 \times 10^{-5}(K^{-1})$ or more, far greater than those of metals and inorganic substances. This causes a large number of problems; for example, composites of organic polymers and metallic or inorganic powders or fibers sometimes peel off or crack when subjected to a heat cycle or the like and the polymers by themselves cannot be molded into articles with dimensional accuracy because of the serious problem of sink mark.

In the manufacture of flexible base materials for printed circuits from films and electric conductors, it is proposed that metal foils are either coated with flexible film-forming materials and cured at elevated temperatures or laminated with flexible films under heat. However, in this method, when cooled to room temperature, the thermal stress arising from the difference in linear expansion coefficient cases the base materials to curl. Furthermore, etching of the copper foil on the flexible base materials releases the stress, causing large dimensional changes.

To prevent occurrence of these phenomena in the flexible base materials, bonding by adhesives which are curable at low temperatures is practiced. In general, however, such low temperature-curable adhesives show poor heat resistance and their application to bonding of metals and heat-resistant films such as those obtained from polyimides inhibits full utilization of the excellent heat resistance inherent in the films in question. Thus, adhesive bonding makes it difficult to manufacture heat-resistant flexible base materials, and often degrades the flame retardancy.

On the other hand, organic polymers applied as coatings on metallic or inorganic substrates of much lower linear expansion coefficients form films which deform, crack, or peel off, or damage the substrates, all due to thermal stresses arising from the large differences in linear expansion coefficient. For example, silicon wafers with protective coatings on in LSI's and IC's warp to varying degrees, making photolithography for patterning unfunctional or yielding poorly resolved patterns. Additional shortcomings are peeling of passivation films and breakdown by cleavage of the silicon wafers themselves.

Problematically high linear expansion coefficients associated with organic polymers have created strong demand for development of organic polymers having low linear expansion coefficients.

As a result, polyimides of low thermal expansivity from aromatic tetracarboxylic acids and aromatic diamines, for example from biphenyltetracarboxylic acid dianhydride and ortho-tolidine, have been proposed in Japanese Kokai Documents Nos. 250,031/1985 and 243,120/1985. These polymers, however, do not necessarily meet some of the property requirements, especially flexibility (endurance to repeated bending and folding) and dimensional stability under heat. Another property needing improvement is adhesive strength.

Polyamide-imides with the following repeating units are disclosed in U.S. Pat. Nos. 3,179,635, 3,511,728 and 3,536,545.

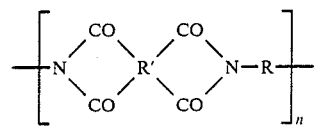

in which n is an integer of at least 5 and R represents a divalent radical selected from the group consisting of

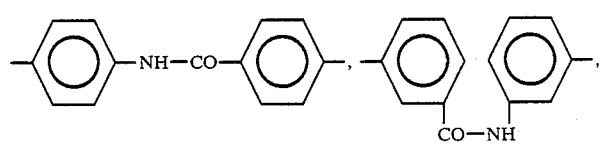

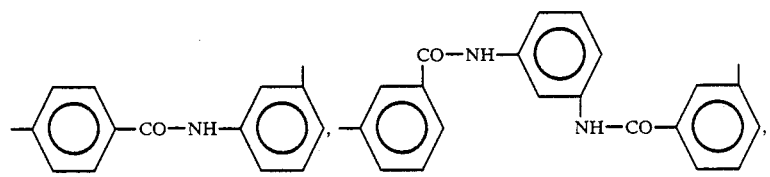

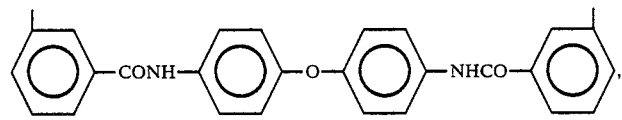

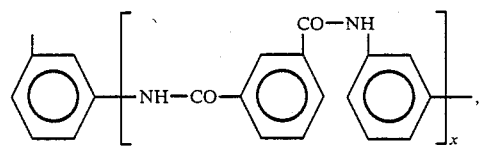

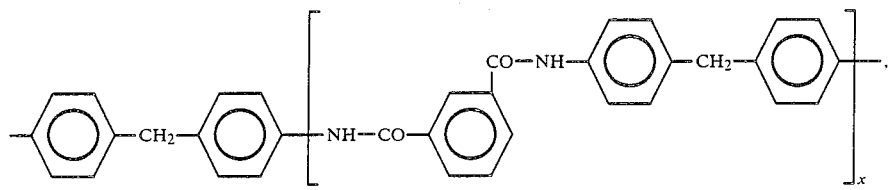

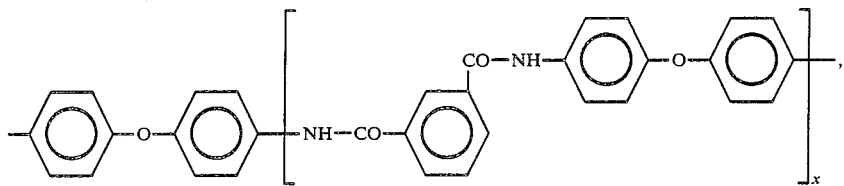

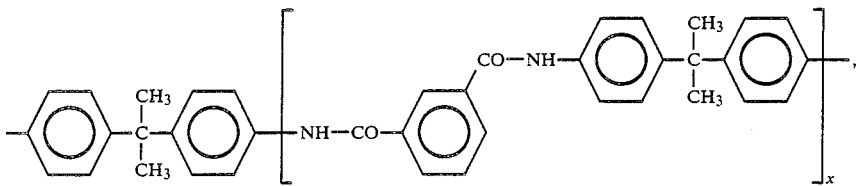

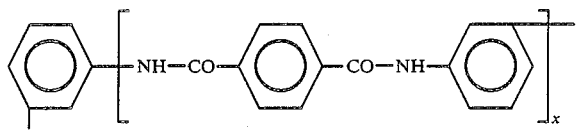

in which X is an integer of from 1 to about 500, and in which R' represents a tetravalent radical selected from the group consisting of

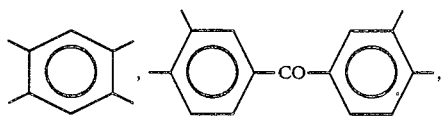

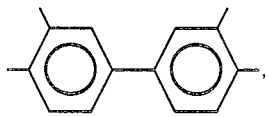

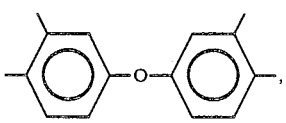

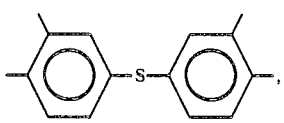

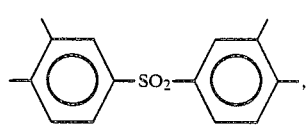

-continued

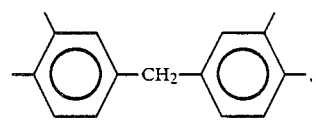

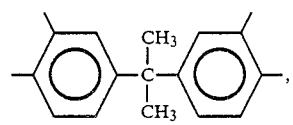

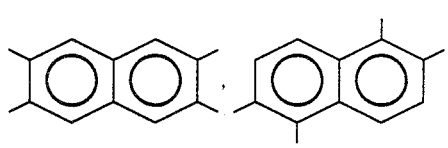

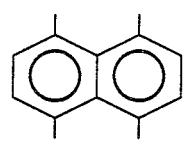

These polyamide-imides have low thermal expansion coefficients, but are not quite satisfactory in water absorption and adhesive strength. When used as insulating materials in flexible base materials for printed circuits, the polymers show poor resistance to soldering.

OBJECT AND SUMMARY OF THE INVENTION

An object of this invention is to provide resins of low thermal expansivity consisting of novel polyamide-imides which have excellent mechanical properties, such as flexibility, and adhesive properties.

A further object of this invention is to provide resins of low thermal expansivity showing reduced moisture absorption.

This invention relates to resins of low thermal expansivity (polyamide-imides) having a structural unit of the general formula (I)

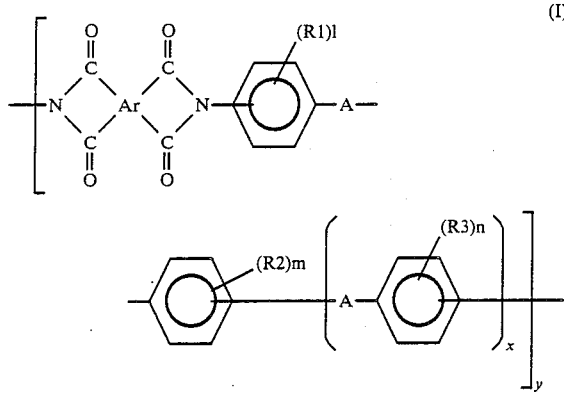

in which Ar is a tetravalent aromatic group, A is —NH-CO—, R1 to R3 are alkyl, alkoxy, or halogen, either identical with or different from one another, l, m, and n are integers from 0 to 4, x is 0 or 1, and y is an integer indicating the number of repeating units and in which at least one alkoxy group is present.

The resins of low thermal expansivity having a repeating unit of the general formula I are prepared by curing polyamide-imide precursors of the general formula (II)

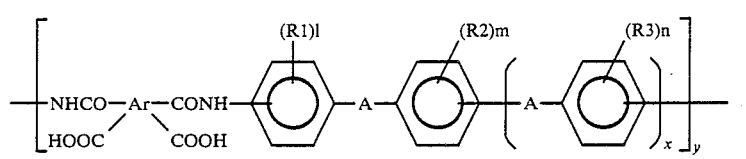

in which Ar, A, R1–R3, l, m n, x, and y are the same as in the general formula I, and in which at least one alkoxy group is present. Such precursors are prepared, in turn, from diamines of the general formula (III)

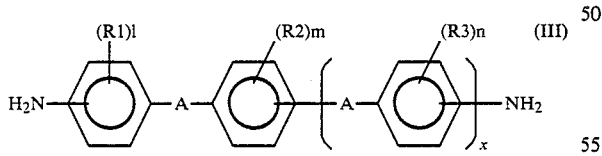

in which A, R1–R3, l, m n, and x are the same as in the general formula I and in which at least one alkoxy group is present and aromatic tetracarboxylic acids of the general formula (IV)

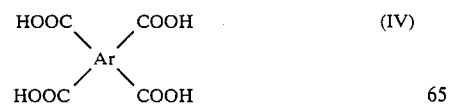

in which Ar is the same as in the general formula I or their derivatives.

The groups Ar, A, and R1–R3 and the subscripts l, m, n, x, and y in diamines of the general formula III and in aromatic tetracarboxylic acids of the general formula IV correspond to those in the structural units I and II.

The substituents R1 through R3 represent alkyl groups, alkoxy groups, or halogens, preferably lower alkyl groups having 5 or less carbon atoms, lower alkoxy groups having 5 or less carbon atoms, or halogens. The above alkyl groups including substituted alkyl groups, and the above alkoxy groups include substituted alkoxy groups. Preferred examples are methyl, ethyl, propyl, methoxy, ethoxy, propoxy, fluorine, chlorine, and bromine. These substituents may be identical with or different from each other, but one of them must be an alkoxy group. The subscripts l, m, and n are integers from 0 to 4; as the presence of at least one alkoxy group is mandatory, the sum of l, m, and n should be 1 or more, preferably 1 or 2. Suitable examples of such alkoxy groups are those with 3 or less carbon atoms, preferably methoxy. This alkoxy substituent is desirably located at an ortho position in the benzene ring adjacent to the amide linkage, more desirable at one of the ortho positions in the benzene ring neighboring the nitrogen atom of the amide linkage. The introduction of the alkoxy group into the structural units improves the adhesive strength and reduces the water absorption of the resins, thus preventing swelling and peeling of the insulating resins during soldering and doing away with drying prior to soldering.

The subscript X is either 0 or 1, preferably 0. When x is 0, it is most desirable that either R1 or R2 is methoxy and the sum of l and m is 1. Furthermore, it is advantageous that, in the benzene ring present between the amide and imide linkages, the alkoxy group is ortho to the amide linkage and the imide linkages is para to the amide linkage.

The tetravalent aromatic group Ar can be any of the aromatic groups such as

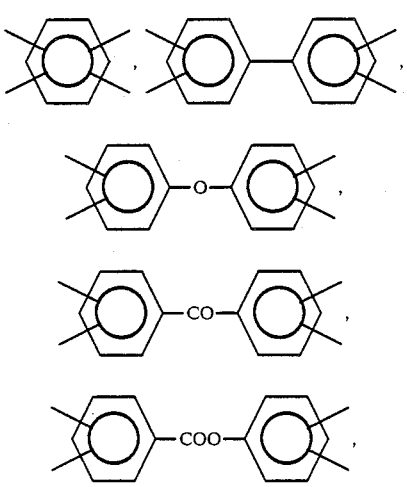

-continued

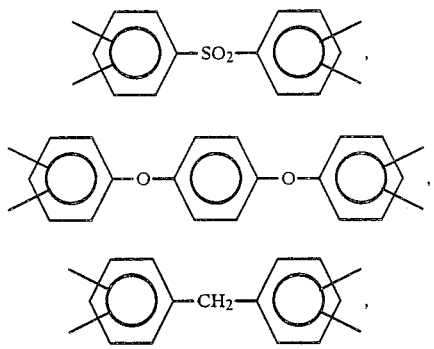

or their alkyl-substituted derivatives, and is preferably

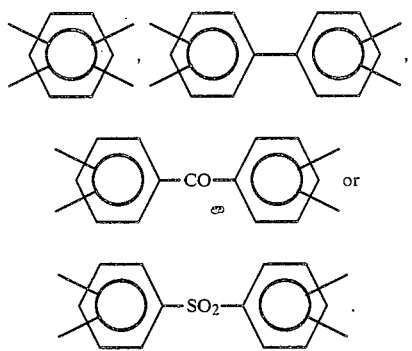

In the general formulas I and II, y indicates the number of repeating units; it is an integer equal to or greater than 1, preferably 5 or more, and more preferably from 10 to 1,000.

Suitable examples of diamines of the general formula III with x=0 include
2-methoxy-4,4'-diaminobenzanilide,
2'-methoxy-4,4'-diaminobenzanilide,
2'-methoxy-4,5'-diaminobenzanilide,
2-ethoxy-4,4'-diaminobenzanilide,
2'-ethoxy-4,4'-diaminobenzanilide,
2-propoxy-3,4'-diaminobenzanilide,
2'-propoxy-4,4'-diaminobenzanilide,
2,2'-dimethoxy-4,4'-diaminobenzanilide,
2-methoxy-2'-ethoxy-4,3'-diaminobenzanilide,
2,6-dimethoxy-4,4'-diaminobenzanilide,
2,2'-dimethoxy-3,4'-diaminobenzanilide,
2,6-diethoxy-4,4'-diaminobenzanilide, and
2,2'-diethoxy-4,4'-diaminobenzanilide.

Of these diamines, 2-methoxy-4,4'-diaminobenzanilide and 2'-methoxy-4,4'-diaminobenzanilide are preferable, particularly the former for its ease of preparation. As examples of diamines of the general formula II with x=1 are cited the following:

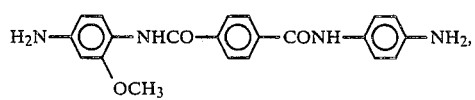

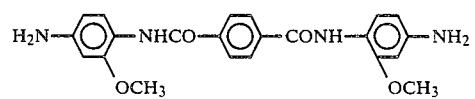

or

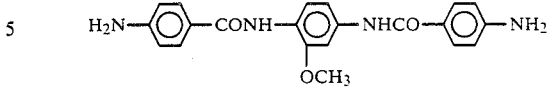

The compounds such as these are disclosed in the aforesaid U.S. Pat. No. 3,179,635 and German Pat. No. 2,255,652 or they can be synthesized according to the methods described in these patents.

Aromatic rings containing 4 carboxyl groups or their derivatives are useful as tetracarboxylic acids of the general formula IV. Examples of such acids (their esters, acid anhydrides, and acid halides are equally effective) are
pyromellitic acid,
3,3',4,4'-biphenyltetracarboxylic acid,
3,3',4,4'-benzophenonetetracarboxylic acid,
3,3',4,4'-diphenyl sulfone-tetracarboxylic acid,
2,3,3',4'-diphenyl ether-tetracarboxylic acid,
2,3,3',4-benzophenonetetracarboxylic acid,
2,3,6,7-naphthalenetetracarboxylic acid,
1,4,5,7-naphthalenetetracarboxylic acid,
1,2,5,6-naphthalenetetracarboxylic acid,
3,3',4,4'-diphenylmethanetetracarboxylic acid,
2,2-bis(3,4-dicarboxyphenyl)propane,
2,2-bis(3,4-dicarboxyphenyl)hexafluoropropane,
3,4,9,10-tetracarboxyperylene,
2,2-bis[4-(3,4-dicarboxyhenoxy)phenyl]propane, and
2,2-bis[4-(3,4-dicarboxyphenoxy)phenyl]hexafluoropropane.

Of these, preferable are pyromellitic acid, 3,3',4,4'-biphenyltetracarboxylic acid, 3,3',4,4'-benzophenonetetracarboxylic acid, and 3,3',4,4'-diphenyl sulfone-tetracarboxylic acid, or their derivatives such as esters, acid anhydrides, and acid halides, with pyromellitic acid or its derivatives being most preferable. Pyromellitic acid or its derivatives is desirable for low thermal expansivity, but two or more tetracarboxylic acid or its derivatives can be used together for improvements in physical properties and adhesive strength. The use of acid anhydrides is advantageous in that they are easy to handle in synthesis and do not yield harmful byproducts.

The synthesis of polyamide-imides can be carried out, for example, in accordance with the method described in U.S. Pat. No. 3,179,635. The reaction is allowed to proceed in a solvent, preferably in N-methylpyrrolidone (NMP), dimethylformamide (DMF), dimethylacetamide (DMAC), dimethyl sulfoxide (DMSO), dimethyl sulfate, sulfolane, butyrolacetone, cresol, phenol, halogenated phenol, cyclohexanone, dioxane, tetrahydrofuran, or diglyme at 0°–200° C., preferably at 0°–100° C. If the reaction temperature exceeds 200° C., the imidation occurs at times in the course of polymerization, making it difficult to acquire the low thermal expansivity and degrading the moldability markedly.

The resins of this invention contain 30 mol% or more, preferably 40 mol% or more, most preferably 50 mol% or more, of polyamide-imides of the structural unit I. With 30 mol% or less, sufficiently low thermal expansivity is not obtained.

As to other structural units, other diamines and tetracarboxylic acids, tricarboxylic acids, or their acid anhydrides may be submitted to random copolymerization; or blocks containing the structural units of this invention may be polymerized with other blocks containing different structural units.

Examples of such other diamines include
p-phenylenediamine, m-phenylenediamine,
3,4'-diaminodiphenyl ether,
4,4'-diaminodiphenyl ether,
4,4'-diaminodiphenylmethane,
3,3'-dimethyl-4,4'-diaminodiphenylmethane,
2,2-bis[4-(4-aminophenoxy)phenyl]propane,
1,2-bis(anilino)ethane,
diaminodiphenyl sulfone,
diaminobenzanilide, diaminobenzoates,
diaminodiphenyl sulfide,
2,2-bis(p-aminophenyl)propane,
2,2-bis(p-aminophenyl)hexafluoropropane,
1,5-diaminonaphthalene,
diaminotoluene,
diaminobenzotrifluoride,
1,4-bis(p-aminophenoxy)benzene,
4,4'-bis(p-aminophenoxy)biphenyl,
diaminoanthraquinone,
4,4'-bis(3-aminophenoxyphenyl)diphenyl sulfone,
1,3-bis(anilino)hexafluoropropane,
1,4-bis(anilino)octafluorobutane,
1,5-bis(anilino)decafluoropentane,
1,7-bis(anilino)tetradecafluoroheptane,
diaminosiloxanes of the general formulas

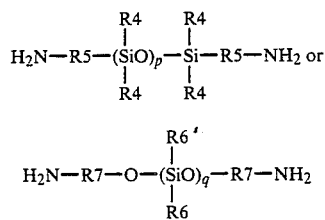

in which R5 and R7 are divalent aromatic groups, R4 and R6 are monovalent arganic groups, and p and q are integers greater than 1,
2,2-bis[4-(p-aminophenoxy)phenyl]hexafluoropropane,
2,2-bis[4-(3-aminophenoxy)phenyl]hexafluoropropane,
2,2-bis[4-(2-aminophenoxy)phenyl]hexafluoropropane,
2,2-bis[4-(4-aminophenoxy)-3,5-dimethylphenyl]hexafluoropropane,
2,2-bis[4-(4-aminophenoxy)-3,5-ditrifluoromethylphenyl]hexafluoropropane,
p-bis(4-amino-2-trifluoromethylphenoxy)benzene,
4,4'-bis(4-amino-2-trifluoromethylphenoxy)biphenyl,
4,4'-bis(4-amino-3-trifluoromethylphenoxy)biphenyl,
4,4'-bis(4-amino-2-trifluoromethylphenoxy)diphenyl sulfone,
4,4'-bis(3-amino-5-trifluoromethylphenoxy)diphenyl sulfone,
2,2-bis[4-(4-amino-3-trifluoromethylphenoxy)phenyl]hexafluoropropane,
benzidine,
3,3',5,5'-tetramethylbenzidine,
octafluorobenzidine,
3,3'-dimethoxybenzidine, o-tolidine, m-tolidine,
2,2',5,5',6,6'-hexafluorotolidine,
4,4''-diaminoterphenyl, and
4,4'''-diaminoquaterphenyl.

Examples of other tetracarboxylic acids or tricarboxylic acids and their derivatives include butanetetracarboxylic acid, cyclopentanetetracarboxylic acid, and trimellitic acid and their esters, acid anhydrides, and acid halides.

Furthermore, modification of the polymers with compounds containing functional groups and introduction of a crosslinked or ladder structure are possible. For example, the following methods are available to achieve such ends.

(1) Introduction of pyrrone and isoindoloquinazolinedione rings by modification with compounds of the general formula

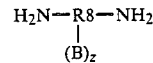

in which R8 is an aromatic group with valence (2+Z), Z is 1 or 2, and B is a substituent selected from $-NH_2$, $-CONH_2$, and $-SO_2NH_2$ and is located ortho to the amino group.

(2) Formation of crosslinked structures by modification with polymerizable unsaturated derivatives of amines, diamines, dicarboxylic acids, tricarboxylic acids, or tetracarboxylic acids followed by curing. Maleic acid, nadic acid, tetrahydrophthalic acid, and ethynylaniline are useful as such unsaturated derivatives.

(3) Formation of network structures by modification with aromatic amines containing phenolic hydroxyl groups or carboxyl groups followed by the reaction of these groups with crosslinking agents.

The polyamide-imides of this invention can be controlled in their linear expansion coefficients by modifications in the above-mentioned manners. Polyamide-imides containing only structures of the general formula I are capable of forming insulators with linear expansion coefficients of $1 \times 10^{-5}(K^{-1})$ or less, which can be reduced further by the above-mentioned modifications.

In order to prepare resins of lower thermal expansivity in accordance with this invention, it is desirable to apply polyamic acids in solution to a given substrate, drive off the solvent, and carry out the imidation on the substrate or under tension. Further lowering of thermal expansivity may be realized by stretching or the like. In contrast, the imidation under no tension tends to increase the linear expansion coefficient.

This invention allows a wide latitude in selection of the temperature for driving off the solvent or for the imidation reaction. The imidation temperature is normally above 200° C., preferably above 250° C., or it can be raised above the glass transition temperature without ill effect.

In bonding polyamide-imides of low thermal expansivity and inorganic materials in accordance with this invention, the adhesive strength can be increased further by roughing the surface of the inorganic materials or by treating the surface with silane coupling agents, titanate coupling agents, aluminum alcoholates, aluminum chelates, zirconium chelates, or aluminum acetylacetone. Furthermore, in undercoating the surface of the inorganic materials by polyimides or its precursors having superior adhesiveness to polyamide-imides in accordance with this invention, the adhesive strength can be increased much more.

In accordance with this invention, mixed use of inorganic, organic, or metallic powders, fibers, or chopped strands is useful for lowering the linear expansion coefficient, raising the modulus, controlling the fluidity, or reducing the production cost. Also, it is possible to blend separately synthesized polyimides, their precursors, or polyamide-imides.

The resins of low thermal expansivity of this invention preferably have linear expansion coefficients of $16 \times 10^{-6} (K^{-1})$ or less. Resins with higher coefficients than this, when applied to metallic or inorganic plates, warp, crack, or peel off, or damage the substrates. Here, the linear expansion coefficient is determined as follows: a solution of the polyamide-imide precuror is applied to a copper foil and cured, the copper foil is etched off, the remaining 25 μm-thick film is heated to 250° C., then cooled at a rate of 10° C. per minute, and the average of the dimensional changes between 240° and 100° C., namely $$\frac{\text{length at } 240° \text{ C.} - \text{length at } 100° \text{ C.}}{(240° \text{ C.} - 100° \text{ C.}) \times \text{length at } 100° \text{ C.}},$$

is taken as linear expansion coefficient.

The water absorption is preferably 3% or less. Resins with water absorption in excess of this not only swell or peel off during soldering but also suffer loss in insulating capability. The water absorption is determined from the changes in weight of a film prepared in the aforesaid manner and immersed in water at room temperature for 24 hours; namely, it is equal to $$\frac{(\text{weight after immersion} - \text{weight before immersion})}{(\text{weight before immersion})} \times 100$$

The resins of low thermal expansivity of this invention are useful for molded articles, films, adhesives, coatings, and the like. Because of their high heat resistance, low linear expansion coefficient, low water absorption, good electric insulation, and excellent flexibility, they are especially useful for films and coatings in the areas requiring good heat resistance and electric insulation such as flexible printed circuit boards, multilayer circuit boards, flat cables, film carriers, coatings on IC's and LSI's, secondary coatings on optical fibers, solar cells, and other sheets, and adhesives requiring heat resistance, light resistance, and dimensional stability. It is also possible to make the resins photosensitive by introduction of photosensitive groups.

The aforesaid polyamide-imides, when used as base films in flexible printed circuit boards, afford warpage-free flexible boards while retaining the mechanical properties characteristic of the known polyimides. Moreover, a solution of the polyamide-imide precursor can be applied directly to a copper foil without the aid of an adhesive. This will make the manufacturing process much simpler than the conventional one of bonding a pre-formed film and a metal foil by an adhesive and advantageously settle the inevitable problem of a sharp drop in heat resistance arising from the use of low temperature-curable adhesives. In addition, there is no problem of reduced flame retardancy normally associated with the use of adhesives, and highly reliable circuit materials are obtained. The polyamide-imides of this invention strongly adhere to copper foils and their low water absorption permits soldering without preliminary drying. Resins with higher water absorption, however, swell or peel off without preliminary drying.

Also, the polyamide-imides of this invention, when applied as film carriers, simplify the manufacturing process and enhances reliability. Polyimide-based varnishes have been used as coatings on IC's and LSI's for the purposes of passivation and shielding of α-ray; the resins of this invention in such use can reduce the strain generated in the chips by the difference in linear expansion coefficient, contributing to higher reliability. The films are less susceptible to peeling because of their high adhesive strength; they are endowed with better properties, and their low water absorption minimizes the loss in reliability from the corrosion of aluminum wire.

The resins of this invention, applied as secondary coatings on optical fibers, have linear expansion coefficients much closer to those of the core, thus reducing the strain and minimizing the optical transmission loss. When a metal foil coated with a polyamide-imide of this invention is used as base plate in an amorphous solar cell, the cracking in the amorphous silicon film occurs much less frequently.

The resins of this invention show small thermal expansion, excellent flexibility, high adhesive strength, and low water absorption, and are highly useful as industrial materials.

DETAILED DESCRIPTION OF PREFERRED EMBODIMENTS

This invention is explained with reference to examples and comparative examples.

The linear expansion coefficient was determined on the fully imidated samples with the aid of a thermomechanical analyzer (TMA) by applying a solution of the polyamide-imide precursor to a copper foil, imidating the precursor, dissolving off the copper foil, heating the remaining 25 μm thick film to 250° C, then cooling the film at a rate of 10° C. per minute, and calculating the average between 240° and 100° C. The adhesive strength was determined with the aid of a Tensilon tester by fixing the resin side of a 10 mm wide resin-coated copper foil to an aluminum plate with the aid of a double-coated adhesive tape and peeling the copper in the 180° C. direction. The water absorption was determined by immersing a film, prepared as in the determination of the linear expansion coefficient, in water at room temperature for 24 hours and measuring the change in weight before and after the immersion. The flexibility test was performed on specimens, 10 mm in width and about 25 μm in thickness, with the aid of an MIT crease-flex fatigue tester (chuck: 0.38 mm R; weight: 1 kg, manufactured by Toyo Seiki Seisaku-sho, Ltd.).

In the examples, the following symbols are used.

PMDA: Pyromellitic acid dianhydride
BPDA: 3,3',4,4'-Biphenyltetracarboxylic acid dianhydride
BTDA: 3,3',4,4'-Benzophenonetetracarboxylic acid dianhydride
DDE: 4,4'-Diaminodiphenyl ether
DDM: 4,4'-Diaminodiphenylmethane
o-TLDN: o-Tolidine

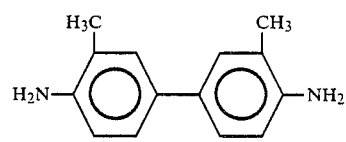

DABA: 4,4'-Diaminobenzanilide

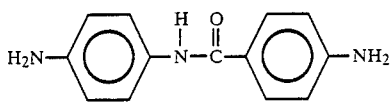

Mt-DABA: 2'-Methyl-4,4'-diaminobenzanilide

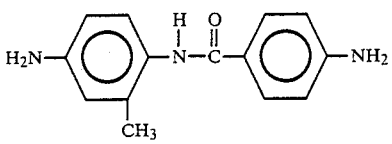

Cl-DABA: 2'-Chloro-4,4'-diaminobenzanilide

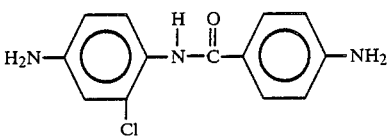

2'-Mo-DABA: 2'-Methoxy-4,4'-diaminobenzanilide

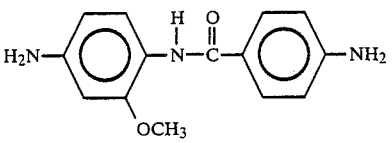

2-Mo-DABA: 2-Methoxy-4,4'-diaminobenzanilide

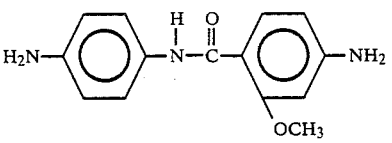

2,2'-dMo-DABA: 2,2'-Dimethoxy-4,4'-diaminobenzanilide

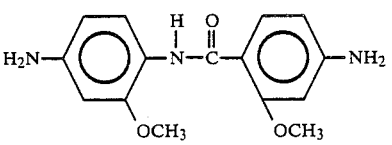

4,5'-dA-2'-MoBA: 4,5'-diamino-2'-methoxybenzanilide

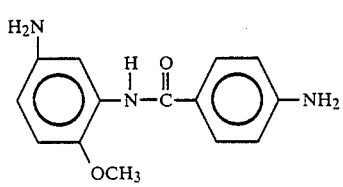

B(4A,2Mo)TPA: Bis(4-amino-2-methoxy)terephthalanilide

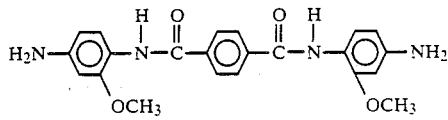

2'-Eo-DABA: 2'-Ethoxy-4,4'-diaminobenzanilide

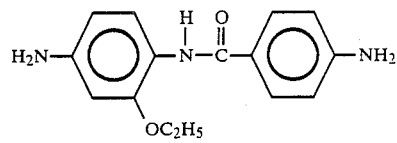

DMAc: Dimethylacetamide
NMP: N-Methyl-2-pyrrolidone

EXAMPLE 1

Into a four-mouthed flask equipped with a thermometer, a calcium chloride drying tube, a stirring rod, and a nitrogen inlet tube were introduced 0.075 mol of 2'-Mo-DABA and 170 ml of DMAc with stirring under nitrogen fed at a rate of 200 ml per minute. Not all the 2'-Mo-DABA dissolved. However, when the solution was cooled below 10° C. in a cold water bath and 0.075 mol of PMDA was added slowly, the reaction took place with the solid 2'-Mo-DABA also dissolving slowly.

After about 20 minutes of the reaction, 0.025 mol of DDE, 0.025 mol of BTDA, and 50 ml of DMAc were added, and the mixture was stirred at room temperature for about 2 hours to give a block copolymer.

An electrolytic copper foil fixed on an aluminum plate was coated with a solution of the block copolymer by an applicator to a film thickness of about 25 μm, placed in a forced-ventilation oven at 130° C. and in another at 150° C. in succession, for 10 minutes in each, for preliminary, drying, and then heated in a circulating hot air oven at 300° C. for imidation. After cooling, the copper foil was dissolved off to obtain a film having a thermal expansion coefficient of $8 \times 10^{-6}(K^{-1})$ and water absorption of 2.8% and enduring 20,000 or more bendings.

Also, this resin solution was applied to a commercially available 35 μm thick electrolytic copper foil fixed on an aluminum plate to a thickness of about 25 μm, placed in a forced-ventilation oven at 130° C. and in another at 150° C. in succession, for 10 minutes in each, and then heated up to 330° C. over a period of 15 minutes for completion of the imidation reaction. A resin sample virtually free of curling was obtained. This resin-coated copper foil had adhesive strength of 1.4 kg/cm, and it produced no changes when it was stored at 76% relative humidity for 24 hours and then immersed in a soldering bath at 260° C. for 10 seconds.

EXAMPLE 2

0.090 mol of 2'-Mo-DABA, 0.010 mol of DDM, and 170 ml of DMAc were introduced into a four-mouthed flask, and 0.090 mol of PMDA and 0.010 mol of BTDA were added slowly with cooling and stirring at room temperature for about 2 hours. A viscous resin solution was obtained after stirring at room temperature for about 2 hours.

The resin gave a film having a linear expansion coefficient of $3 \times 10^{-6}(K^{-1})$ and water absorption of 2.8% and enduring 50,000 or more bendings. A copper foil coated with the resin showed adhesive strength of 1.0 kg/cm and produced no recognizable defects when immersed in a solvering bath.

EXAMPLES 3 AND 4

Resins were prepared as in Example 1 with 2'-Mo-DABA replaced by 2-Mo-DABA or 2,2'-dMo-DABA. The results are shown in Table 1.

EXAMPLE 5

As in Example 2, 0.10 mol of 2'-Mo-DABA and 170 ml of DMAc were introduced into a four-mouthed flask and 0.10 mol of PMDA was added slowly with cooling and stirring. A viscous resin solution was obtained after stirring at room temperature for about 2 hours. The resin gave a film having a linear expansion coefficient of $1 \times 10^{-6}(K^{-1})$ and water absorption of 2.8%. The results are shown in Table 1.

EXAMPLE 6

As in Example 2, 0.10 mol of 2'-Mo-DABA and 170 ml of NMP were introduced into a four-mouthed flask and 0.10 mol of SPDA was added slowly with cooling and stirring. A viscous resin solution was obtained after stirring at room temperature for about 3 hours.

The resin gave a film having a linear expansion coefficient of $15 \times 10^{-6}(K^{-1})$ and water absorption of 2.0%.

EXAMPLE 7

As in Example 2, 0.10 mol of 4,5'-dA-2'-MoBA and 170 ml of DMAc were introduced into a four-mouthed flask and 0.10 mol of PMDA was added slowly with cooling and stirring. A viscous resin solution was obtained after stirring at room temperature for about 3 hours.

The resin gave a film having a linear expansion coefficient of $14 \times 10^{-6}(K^{-1})$ and water absorption of 2.9%.

EXAMPLE 8

As in Example 2, 0.075 mol of B(4A,2Mo)TPA, 0.025 mol of DDE, and 170 ml of DMAc were introduced into a four-mouthed flask and 0.10 mol of PMDA was added slowly with cooling and stirring. A viscous resin solution was obtained after stirring at room temperature for about 3 hours.

The resin gave a film having a linear expansion coefficient of $12 \times 10^{-6}(K^{-1})$ and water absorption of 2.8%.

EXAMPLE 9

As in Example 2, 0.049 mol of 2'-Eo-DABA, 0.051 mol of DDE, and 170 ml of DMAc were introduced into a four-mouthed flask and 0.1 mol of PMDA was added slowly with cooling and stirring. A viscous resin solution was obtained after stirring at room temperature for about 2 hours.

The resin gave a film having a linear expansion coefficient of $15 \times 10^{-6}(K^{-1})$ and water absorption of 2.5%.

COMPARATIVE EXAMPLES 1 THROUGH 3

Resins were prepared as in Example 1 with 2'-Mo-DABA replaced by DABA, Mt-DABA, or Cl-DABA. The results are shown in Table 1.

COMPARATIVE EXAMPLE 4

A resin was prepared as in Example 2 from o-TLDN and BPDA in NMP. The resin exhibited poor flexibility.

COMPARATIVE EXAMPLE 5

A resin was prepared as in Example 2 from DDE and PMDA in DMAc. The resin had a high thermal expansion coefficient.

TABLE 1

| | Amine Component | | Acid Anhydride Component | | Properties of Film | | | Properties of Resin-coated Copper | |
|---|---|---|---|---|---|---|---|---|---|
| | Kind | Amount Used Mol % | Kind | Amount Used Mol % | Thermal Expansion Coefficient × $10^{-6}$ ($K^{-1}$) | Moisture Absorption % | Flexibility Test No. of Bendings | Adhesive Strength Kg/cm | Soldering Resistance |
| Example 1 | 2'-Mo—DABA | 0.075 | PMDA | 0.075 | 8 | 2.8 | >50,000 | 1.4 | Good |
| | DDE | 0.025 | BTDA | 0.025 | | | | | |
| Example 2 | 2'-Mo—DABA | 0.09 | PMDA | 0.09 | 3 | 2.8 | >50,000 | 1.0 | Good |
| | DDM | 0.01 | BTDA | 0.01 | | | | | |
| Example 3 | 2-Mo—DABA | 0.075 | PMDA | 0.075 | 8 | 2.9 | >50,000 | 1.4 | Good |
| | DDE | 0.025 | BTDA | 0.025 | | | | | |
| Example 4 | 2,2'-dMo—DABA | 0.075 | PMDA | 0.075 | 15 | 2.5 | >50,000 | 1.5 | Good |
| | DDE | 0.025 | BTDA | 0.025 | | | | | |
| Example 5 | 2'-Mo—DABA | 0.10 | PMDA | 0.10 | 1 | 2.8 | 10,000 | 1.0 | Good |
| Example 6 | 2'-Mo—DABA | 0.10 | BPDA | 0.10 | 15 | 2.0 | >50,000 | 1.1 | Good |
| Example 7 | 4,5'-dA—2'-MoBA | 0.10 | PMDA | 0.10 | 14 | 2.9 | 10,000 | 1.0 | Good |
| Example 8 | B(4A,2Mo)TPA | 0.075 | PMDA | 0.10 | 12 | 2.8 | 10,000 | 1.0 | Good |
| | DDE | 0.025 | | | | | | | |
| Example 9 | 2'-Eo—DABA | 0.049 | PMDA | 0.10 | 15 | 2.5 | >50,000 | 1.0 | Good |
| | DDE | 0.051 | | | | | | | |
| Comparative Example 1 | DABA | 0.075 | PMDA | 0.075 | 5 | 7.0 | 5,000 | 0.6 | Poor |
| | DDE | 0.025 | BTDA | 0.025 | | | | | |
| Comparative Example 2 | Mt—DABA | 0.075 | PMDA | 0.075 | 10 | 4.5 | 5,000 | 0.6 | Poor |
| | DDE | 0.025 | BTDA | 0.025 | | | | | |
| Comparative Example 3 | Cl—DABA | 0.075 | PMDA | 0.075 | 10 | 4.0 | 3,000 | 0.5 | Poor |
| | DDE | 0.025 | BTDA | 0.025 | | | | | |
| Comparative Example 4 | o-TLDN | 0.10 | BPDA | 0.10 | 20 | 2.9 | 200 | 0.9 | Good |
| Comparative Example 5 | DDE | 0.10 | PMDA | 0.10 | 35 | 3.5 | >50,000 | 0.7 | Good |

What is claimed is:

1. Resins of low thermal expansivity containing 30 mol% or more a repeating structural unit of the general formula (I)

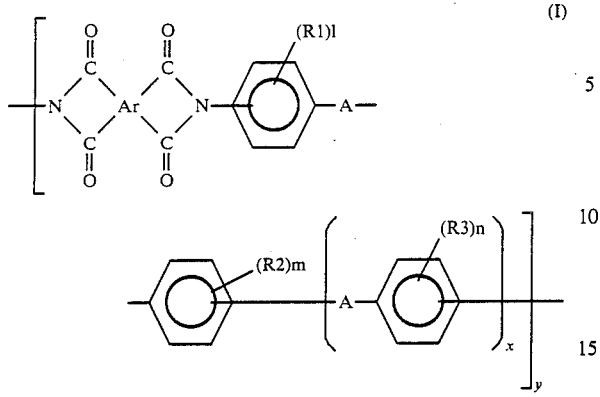

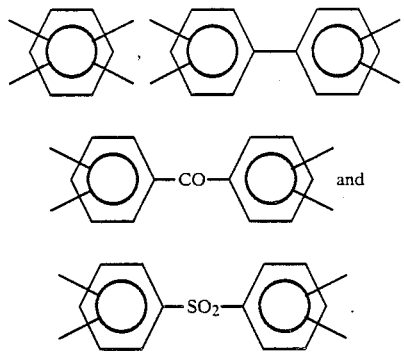

in which Ar is a tetravalent aromatic group, A is —NH-CO—, R1 through R3 are alkyl, alkoxy, or halogen, l, m, and n are integers from 0 to 4, x is 0 or 1, and y is an integer indicating the number of repeating units and in which at least one alkoxy group is present.

2. Resins of low thermal expansivity according to claim 1, wherein the alkoxy group is a loer alkoxy group having 3 or less carbon atoms.

3. Resins of low thermal expansivity according to claim 1, wherein the alkoxy group is methoxy.

4. Resins of low thermal expansivity according to claim 1, wherein the alkoxy group is located at the ortho position in the benzene ring adjacent to the amide linkage.

5. Resins of low thermal expansivity according to claim 1, wherein the alkoxy group is located at the ortho position in the benzene ring adjacent to the nitrogen atom of the amide linkage.

6. Resins of low thermal expansivity according to claim 1, wherein Ar in the general formula I is 1 or more groups selected from 7. Resins of low thermal expansivity according to claim 1, wherein x is 0, R1 or R2 is methoxy, and (l+m) is 1 in the general formula I.

8. Resins of low thermal expansivity according to claim 1, wherein the linear thermal expansion coefficient is $16 \times 10^{-6}(K^{-1})$ or less.

9. Resins of low thermal expansivity according to claim 1, wherein the water absorption is 3% or less.

10. Resins of low thermal expansivity according to claim 1, wherein the resins contain 40 mol% or more of the repeating structural unit of the general formula I.

* * * * *